(12) United States Patent
Wernersson (10) Patent No.: US 8,890,117 B2
(45) Date of Patent: Nov. 18, 2014

(54) NANOWIRE CIRCUIT ARCHITECTURE (75) Inventor: Lars-Erik Wernersson, Lund (SE)

(73) Assignee: Qunano AB, Lund (SE)

( * ) Notice: Subject to any disclaimer, the term of this patent is extended or adjusted under 35 U.S.C. 154(b) by 981 days.

(21) Appl. No.: 12/450,372

(22) PCT Filed: Mar. 28, 2008

(86) PCT No.: PCT/SE2008/050362
§ 371 (c)(1),
(2), (4) Date: Jan. 8, 2010

(87) PCT Pub. No.: WO2008/118095
PCT Pub. Date: Oct. 2, 2008

(65) Prior Publication Data
US 2010/0155702 A1      Jun. 24, 2010

(30) Foreign Application Priority Data

Mar. 28, 2007  (SE) .................................... 0700794
Mar. 29, 2007  (SE) .................................... 0700816

(51) Int. Cl.
| | | |
|---|---|---|
| H01L 51/56 | (2006.01) | |
| H01L 29/06 | (2006.01) | |
| H01L 21/8238 | (2006.01) | |
| H01L 27/088 | (2006.01) | |
| H01L 27/092 | (2006.01) | |
| B82Y 10/00 | (2011.01) | |
| H01L 21/8234 | (2006.01) | |
| H01L 29/786 | (2006.01) | |

(52) U.S. Cl.
CPC ...... *H01L 29/78642* (2013.01); *H01L 29/0676* (2013.01); *H01L 29/78687* (2013.01); *H01L 21/823885* (2013.01); *H01L 27/088* (2013.01); *H01L 29/78684* (2013.01); *H01L 27/092* (2013.01); *B82Y 10/00* (2013.01); *H01L 29/78681* (2013.01); *H01L 29/0673* (2013.01); *H01L 21/823487* (2013.01)
USPC ............................................ 257/24; 257/168

(58) Field of Classification Search
USPC ...................... 257/24, 168, E29.168; 977/938
See application file for complete search history.

(56) References Cited

U.S. PATENT DOCUMENTS 4,164,926  A  *  8/1979  Kindlmann ............... 123/406.59
5,764,111  A  *  6/1998  Bushman ......................... 331/57

(Continued)

FOREIGN PATENT DOCUMENTS

EP          1804286 A1     7/2007
JP       2004-165297 A     6/2004

(Continued)

OTHER PUBLICATIONS

Bryllert et al. "Verticial High-Mobility Wrap-Gated InAs Nanowire Transistor" IEEE Electron Device Letters, 27(5), pp. 323-325 (2006).*

(Continued)

*Primary Examiner* — Michael Shingleton
(74) *Attorney, Agent, or Firm* — The Marbury Law Group PLLC (57) ABSTRACT

A nanowire circuit architecture is presented. The technology comprises of nanowire transistors (8,9), and optionally nanowire capacitors (12) and nanowire resistors (11), that are integrated using two levels of interconnects only (1,2). Implementations of ring-oscillators, sample-and-hold circuits, and comparators may be realized in this nanowire circuit architecture. Circuit input and circuit output as well as the transistor connections within each circuit are provided in the two levels of interconnects (1,2).

16 Claims, 7 Drawing Sheets

(56) References Cited

U.S. PATENT DOCUMENTS

| | | |
|---|---|---|
| 7,335,908 B2 | 2/2008 | Samuelson et al. |
| 7,892,956 B2 * | 2/2011 | Deligianni et al. ........... 438/585 |
| 2004/0075464 A1 | 4/2004 | Samuelson et al. |
| 2004/0188738 A1 | 9/2004 | Farnworth et al. |
| 2004/0253805 A1 | 12/2004 | Dubin et al. |
| 2005/0224888 A1 | 10/2005 | Graham et al. |
| 2005/0253143 A1 * | 11/2005 | Takaura et al. ................. 257/67 |
| 2006/0244361 A1 | 11/2006 | Kim et al. |
| 2006/0273389 A1 | 12/2006 | Cohen et al. |

FOREIGN PATENT DOCUMENTS

| | | |
|---|---|---|
| JP | 2005-159332 A | 6/2005 |
| JP | 2007-059680 A | 3/2007 |
| WO | WO 2006/005020 A2 | 1/2006 |
| WO | 2006/011073 A1 | 2/2006 |
| WO | WO 2006/135336 A1 | 12/2006 |
| WO | 2008/034823 A1 | 3/2008 |
| WO | 2008/118084 A1 | 10/2008 |

OTHER PUBLICATIONS

Bryllert et al., "Vertical High-Mobility Wrap-Gated InAs Nanowire Transistor," IEEE Electron Device Letters, May 2006, 27(5):323-325.

European Search Report issued in EP Application No. 08724308.5, mailed on Aug. 10, 2012.

Verhulst, Anne S., et al. "Tunnel field-effect transistor without gate-drain overlap"; Applied Physics Letters; vol. 91, No. 5; Jul. 2007.

Thelander, C., et al. "Nanowire-based one-dimensional electronics"; Materials Today; Elsevier Science; vol. 9, No. 10; Oct. 2006.

* cited by examiner

NANOWIRE CIRCUIT ARCHITECTURE

CROSS-REFERENCE TO RELATED APPLICATIONS

This application is a National Stage application of PCT/SE2008/050362, filed Mar. 28, 2008, which claims priority from Swedish applications SE 0700794-1, filed Mar. 28, 2007 and SE 0700816-2, filed Mar. 29, 2007.

TECHNICAL FIELD OF THE INVENTION

The present invention relates to a circuit architecture comprising nanowire transistors and optionally nanowire resistors and capacitors. In particular the present invention relates to nanowire transistors having wrap gate electrodes, i.e. so called WIGFETs.

BACKGROUND OF THE INVENTION

Power consumption and speed are inherently coupled for a given semiconductor technology. Contact resistances and transport properties are related to the band gap of the semiconductors, which affects current levels and drive voltages. In order to reduce the power consumption and to increase the performance of certain key circuits, for instance for wireless communication, it would be attractive to fabricate those circuits in a different material than Si.

Semiconductor nanowire transistors are considered as one of the candidates in the post-CMOS electronics era. In particular a vertical nanowire configuration allows for a wrap gate formation that efficiently controls the electrostatic potential inside the wires, which enhances the transconductance and reduces the sub-threshold slope.

The growth of nanowires offers new possibilities in heterostructure design as radial strain relaxation allows a large range of new compositions to be fabricated. InP can, for example, be grown on InAs without defects as described in U.S. Pat. No. 7,335,908 or US 2004/0075464 by the same applicant as the present invention. It is also possible to use a substrate that is not lattice matched to the wires, which offers even more design flexibility and opens up a route to integrate III-V semiconductors on Si.

Semiconductor nanowires are in this context defined as rod-shaped structures with a diameter less than 200 nm and a length of several µm. The growth of semiconductor nanowires can be done in various ways, for example by Vapor Phase Epitaxi (VPE) using metal particles to assist the anisotropic growth as disclosed in US 2004/0075464 A1.

In the nanowire geometry of the FET the gate will surround the narrow nanowires providing good gate coupling, and heterostructures can be placed in the current channel as described in WO 2006/05020, forcing the source-drain current to pass through the heterostructure interfaces. This offers the possibility to improve the device characteristics.

Figure 1:
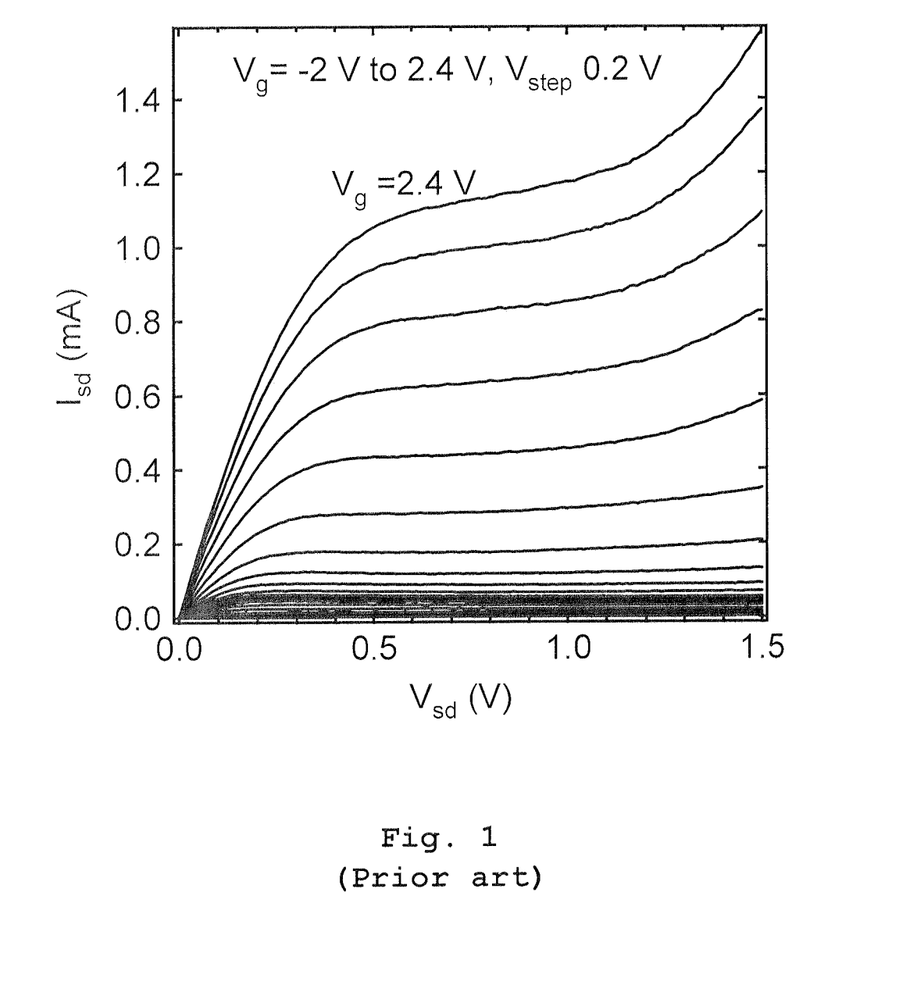
FIG. 1 is a diagram of measured IV characteristics of a prior art nanowire wrap-gate transistor, WIGFET, FIGS. 2a and b are schematic illustrations of an inverter according to the present invention.

FIG. 1 shows data for a prior art InAs nanowire wrap gate transistor. The drive current level in transistors with individual nanowires like this one is typically limited to below 100 µA, which is too low for most analogue and mixed-mode circuit applications. Also for digital applications the current level is critical. This problem may be eliminated by placing nanowires in a row, or a matrix, and addressing all the nanowires simultaneously. A patterned substrate will be used as one of the source/drain contacts, on which the nanowires will be grown by controlled nucleation, while the other source/drain contact is formed on top of the wires. The gate level metallization is formed in an interconnection level between the substrate and the top contact.

Transistor pairs (NMOS and PMOS in CMOS, and enhancement mode FETs and depletion mode FETs in different variations of directly coupled field logic, DCFL) are fundamental building blocks for digital, analogue, and mixed-mode applications. Using nanowire circuit architecture, transistors with complementary function may be placed in a vertically stacked configuration, with ohmic contacts to a center region of the wires acting as an output node. In many applications, like a ring-oscillator, this output node should be connected to both gates in the next stage, which requires a three-level interconnection metallization scheme for the gates only. Connections between the various interconnection levels are further required.

In addition to transistors passive elements such as resistors and capacitors has to be added to enable the design of a wider range of circuits including, sample-and-hold circuits and comparators. This increases the complexity of the interconnections of the circuits. The integration of the resistors, capacitors, and transistors enables a wide variety of circuits including, sample-and-hold circuits and comparators.

SUMMARY OF THE INVENTION

Obviously the prior art has drawbacks with regards to being able to provide fundamental circuits made in a nanowire circuit architecture.

The object of the present invention is to overcome the drawbacks of the prior art. This is achieved by a nanowire circuit as defined in the independent claims.

A nanowire circuit according to the present invention comprises at least a first vertical nanowire transistor comprising a first nanowire protruding from a substrate. The nanowire has a first wrap gate electrode arranged around a portion of its length. Only two levels of interconnects are used, one of which is a first interconnect level located on the substrate providing an electrode connected to one end of the first nanowire. Furthermore, the first wrap gate electrode of the first nanowire is provided in one of the two interconnect levels.

The nanowire circuit may comprise a second nanowire transistor comprising a second nanowire having a second wrap gate electrode arranged around a portion of its length, wherein the first and the second nanowires have the same charge carrier types. By having different threshold voltages complementary enhancement mode and depletion mode WIGFETs can be combined.

In one embodiment the nanowire circuit of the present invention comprises resistors, which are non-gated nanowires.

In another embodiment the nanowire circuit of the present invention comprises capacitors in a nanowire configuration, wherein the size and number of nanowires are used to set the capacitance value.

Thanks to the invention it is possible to form nanowire circuits in a simple architecture using only two levels of interconnects, wherein wrap gate electrodes are provided in one of the two levels of interconnects, which simplifies the fabrication, improves the reliability and improves the performance of fundamental circuits. Parasitic capacitances can also be reduced.

It is a further advantage of the invention to provide fundamental circuits, including an inverter, a ring-oscillator, a sample-and-hold circuit, and a comparator, based on the nanowire circuit architecture with only two levels of interconnects comprising wrap gate transistors and optionally nanowire resistors and/or nanowire capacitors These are key sub-circuits for the construction of analogue-to-digital converters, but will also find a wider use in other applications. Benefits of the fundamental circuits according to the invention are e.g. increased clock-frequency of the oscillator and increased resolution of the sample-and-hold circuit.

BRIEF DESCRIPTION OF THE DRAWINGS

Preferred embodiments of the invention will now be described with reference to the accompanying drawings, wherein.

DETAILED DESCRIPTION OF EMBODIMENTS

The present invention is based on nanowires protruding from a substrate, which often is referred to as vertical nanowires. The vertical nanowires may be used as building blocks in nanowire circuits to form e.g. nanowire wrap gate transistors, WIGFETs.

The nanowires of the present invention may comprise materials selected from the group of Si, Ge, SiGe, III-Vs (such as AlAs, GaAs, InP, GaP, InAs, InSb or alloys thereof), or nitrides (such as GaN, InN, AlN or alloys thereof). However, a person skilled in the art knows that there are more examples of possible materials. The nanowires may further comprise heterostructures distributed along the length thereof and/or radially arranged.

A nanowire transistor according to the present invention is based on vertical nanowires (typically 1 to 500) in a matrix formation where a metal electrode is wrapped around the nanowires to form the gate electrode. The layout and the processing of such nanowire transistors have previously been described in the literature [Bryllert et al *IEEE Electron Device Lett.* vol. 27, no. 5, p. 323, 2006] and in an international patent application [Wernersson et al WO2006135336].

The circuit architecture can be simplified by the fact that nanowires, in addition to active elements (transistors), can be used to form passive elements, such as resistors and capacitors.

Figure 7A:
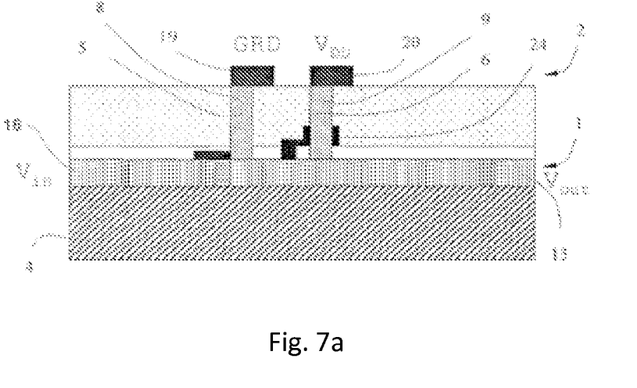
FIGS. 7a and 7b are schematic illustrations of a nanowire resistor and nanowire capacitor, respectively.

A nanowire resistor according to the present invention employs the same geometry as the nanowire transistor, but with the distinction of a lack of a gate to the nanowires. The resistance may be set by the geometry of the nanowire, the conductivity, and the length thereof. Also the number of wires may be adjusted to design the resistance. The nanowire resistor thus consists vertical nanowires (typically 1 to 500) with a diameter of 5 to 200 nm placed in parallel to form the resistor. Series connections of nanowires may also be used to increase the resistance of the element. Also the nanowire transistors themselves may be used as resistors in an alternative implementation. One benefit of the nanowire approach is that the resistors in this configuration basically are transistors without a gate (FIG. 7a) and that the resistors may be fabricated in the same way as the transistors.

Figure 7B:
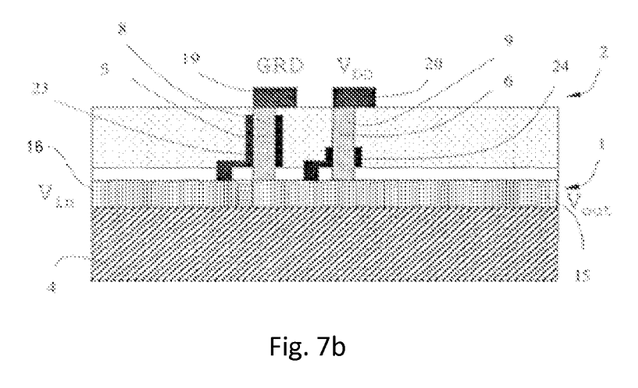

A nanowire capacitor according to the present invention consists of a number (typically 1 to 500) of nanowires in a vertical geometry similar to the transistor geometry. A wrap-around metal is formed and the metal is used as the one capacitor electrode and the nanowire as the other capacitor electrode. Basically the nanowire capacitors are fabricated as nanowire transistors with extended gate length (FIG. 7b). The nanowires may be contacted from the substrate side or from the top side or from both sides. In an alternative implementation, the metal covers the top of the nanowire and the nanowires are only contacted from one side. The capacitance of the capacitor is set by the number of wires in the capacitor, the diameter of the nanowires, the length of the wrap-around gate (10 to 3000 nm) and the thickness and dielectric constant of the dielectric layer. The dielectric layer may be any high-k material like $AlO_3$, $HfO_2$, $TiO_2$, $SiN_x$, $SiO_2$, or combinations thereof.

A nanowire circuit according to the present invention comprises a selection of the nanowire elements described above. According to the invention the transistor geometry is such that the gate electrode is formed on the same interconnect level as the source or drain electrode and that any sub-circuits may be formed using only two levels of interconnects. The term "interconnect" is in this application interpreted as electrical connections within the circuits, such as for example a terminal connecting to a nanowire, a connection between two nanowires, an input terminal, etc. An "interconnect level" typically comprise a plurality of electrical connections distributed on a lateral level.

The invention will be illustrated further by examples of different circuits, representing different embodiments of the invention. The circuits are to be seen as non-limiting examples. The inventive concept can be utilized also in other circuits, which the skilled in the art will be able to design given the present description. In all of these embodiments, two level of interconnects are used and gate access is provided in the one of the two levels of interconnects.

Figure 2A:
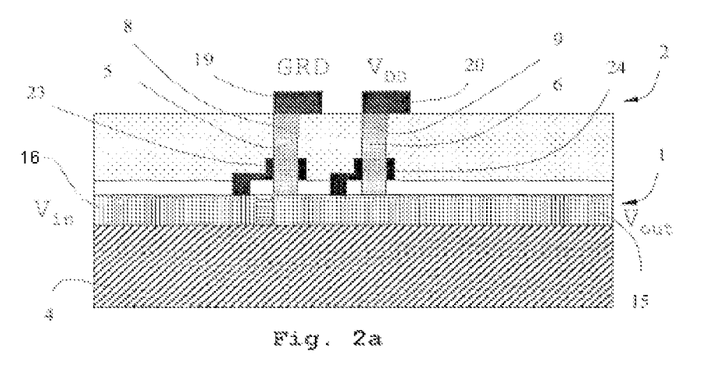
Figure 2B:
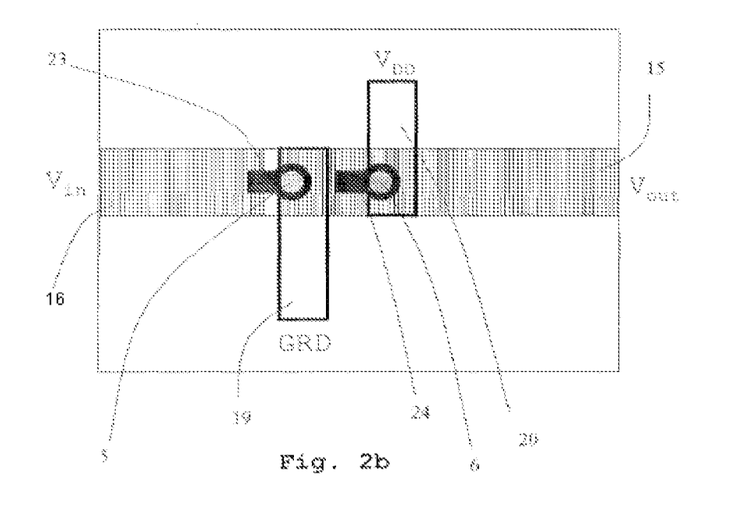

Referring to FIGS. 2a and b, a nanowire circuit according to the present invention comprises at least a first nanowire transistor 8 comprising a first nanowire 5 protruding from a substrate 4. The first nanowire 5 has a first wrap gate electrode 23 arranged around a portion of its length. Two levels of interconnects 1, 2 are used to accomplish the source and drain contacts and the wrap gate electrode 23 of the nanowire transistor 8. One of the interconnect levels is a first interconnect level 1 located on the substrate 4 providing an electrode 16 connected to a base end of the first nanowire 8. The first wrap gate electrode 23 of the first nanowire 8 is provided in one of the two interconnect levels 1,2.

FIG. 2a and b further schematically illustrates one embodiment of the present invention which forms an inverter circuit. The inverter comprises a first and a second nanowire 5, 6 side by side protruding from a substrate 4. An input electrode 16 and an output electrode 15 is formed in a first interconnect level 1 located on the substrate 4. The first and the second nanowire 5, 6 are placed on the output electrode 15. Individual electrodes 19, 20 are formed on top of each nanowire 5, 6. The first and the second nanowire 5, 6 have a first and a second wrap gate electrode 23, 24 arranged along a portion of the length thereof, respectively. The first wrap gate electrode 23 is connected to the input electrode 16 and the second wrap gate electrode 24 is connected to the output electrode 15. Both wrap gate electrodes 23, 24 are provided within the first level of interconnect 1, however not limited to this. The arrangement of the first and the second nanowire 5, 6 forms complementary enhancement mode and depletion mode WIGFETs 8, 9, respectively. According to this embodiment the nanowires 5, 6 have the same charge carrier type, i.e. the nanowires 5, 6 are both either n-type or p-type, although having different threshold level. Hence the nanowire transistors can be regarded as unipolar transistors. However the nanowire transistors can be made without any pnp-region or npn-region as in MOSFETs.

In one embodiment of the present invention the electrodes 15, 16 of the first interconnect level 1 located on the substrate connects to the nanowires 5,6 in a wrap around configuration.

Figure 3:
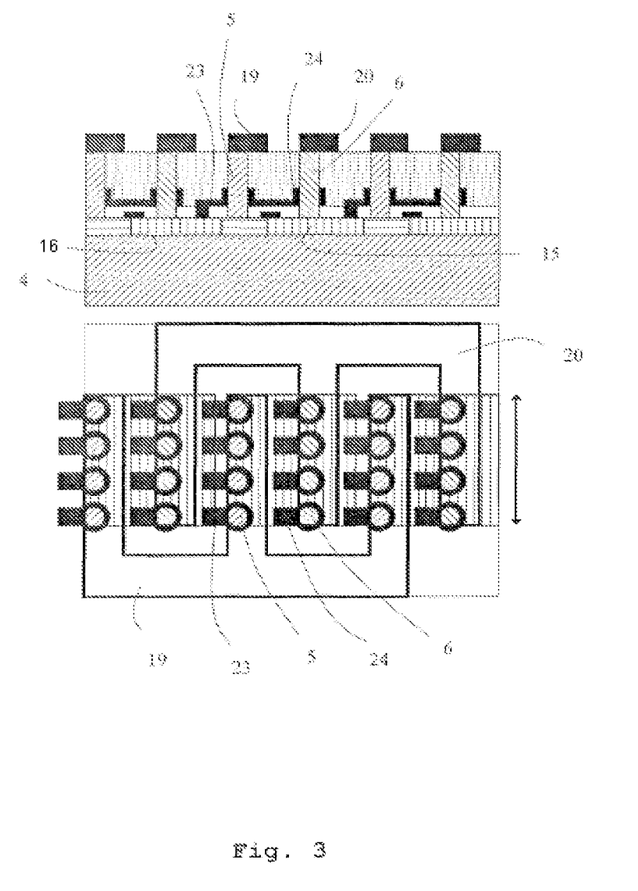
FIG. 3 is a schematic illustration of a ring-oscillator using complementary nanowire transistors according to the present invention.

FIG. 3 schematically illustrates a side view and a top view of a CMOS ring-oscillator according to the present invention, which is based on the use of both n-type 8 and p-type 9 nanowire transistors. The basic function is an inverter with a series connection of one transistor 8, 9 of each type that has the same input to the gates 23, 24 and where the output 15 is from the node between the two transistors 8, 9. A fixed potential is applied over the transistor pair 8, 9 and a ring-oscillator is formed by connecting the output 15 in one inverter to the input 16 of the next in an odd number of transistor pairs. In the vertical nanowire technology, the inverter pair may be formed by placing the two types of nanowire transistors 8,9 in parallel and by patterning of a substrate electrode 15 and the top electrode 19, 20. The substrate electrode 15 forms the output node of the inverter and the two transistors 8, 9 are placed on this electrode 15, while they have individual top electrodes (ground (GRD) 19 and drive voltage ($V_{dd}$) 20, respectively). The transistors are connected to the same gate electrode 23, 24 (input) that in turn is connected to the output electrode 15 (substrate electrode) of the previous stage in the oscillator. By connecting the output 15 of the last stage in the series to the first one, for instance via pattering of the substrate electrode, the oscillator is formed. The patterning may give an alternation of P-well and N-well regions along the substrate electrode. The p-well and N-well regions may be connected by a ohmic contact placed on top of the N/P-well regions. In an alternative implementation, the substrate 15 and top electrode 19, 20 have the opposite geometry. One benefit of this technology is that the oscillator is formed using only two layers of interconnects 1, 2.

Figure 4:
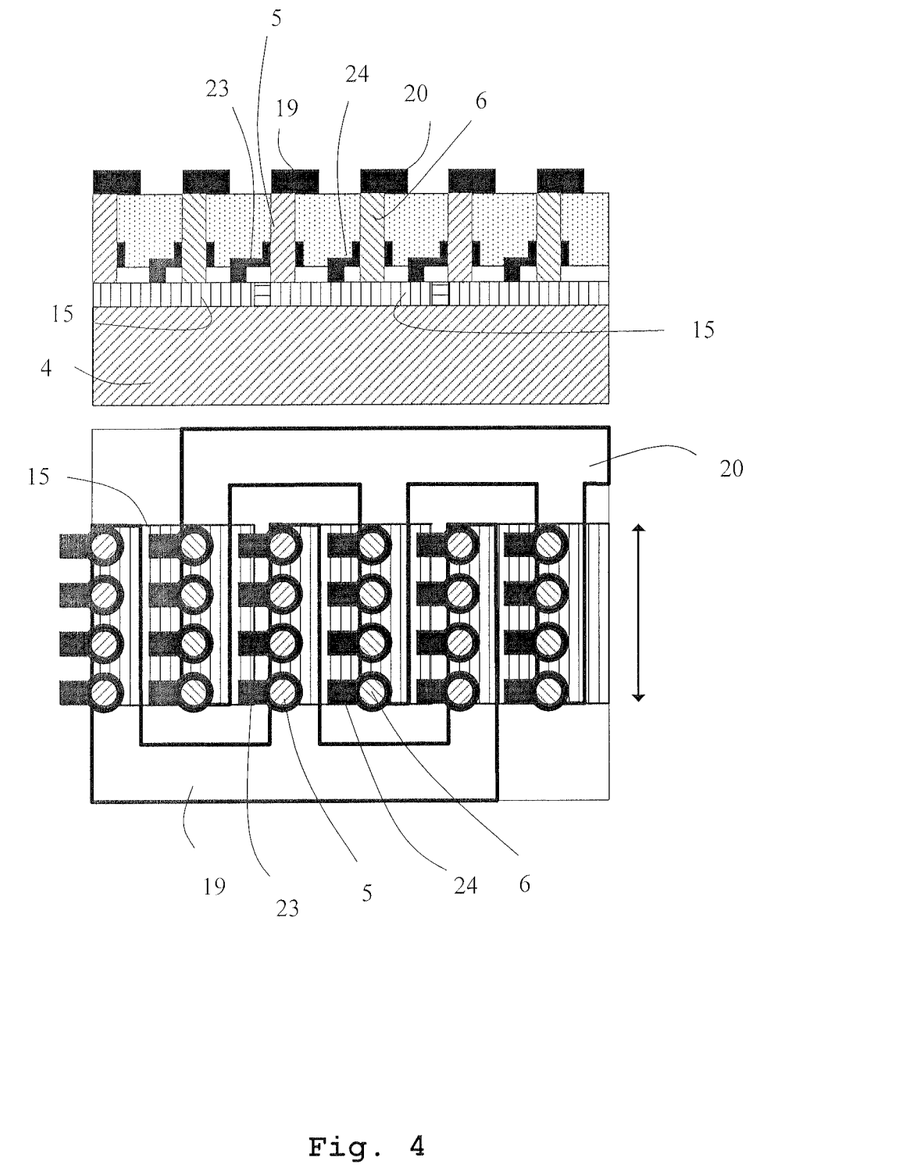
FIG. 4 is a schematic illustration of a ring-oscillator using enhancement mode and depletion mode nanowire transistors according to the present invention.

FIG. 4 illustrates a side view and a top view of a DCFL ring-oscillator according to the present invention, which is based on the use of transistors with different threshold voltages 8, 9. The basic function is an inverter with a series connection of one transistor of each type, and where input is provided to the one transistor (the other acting as a load with the gate connected to the output) and where the output 15 is from the node between the two transistors 8, 9. A fixed potential is applied over the transistor pair and a ring-oscillator is formed by connecting the output in one inverter to the input of the next in an odd number of transistor pairs. In the vertical nanowire technology, the inverter pair may be formed by placing the two types of nanowire transistors 8, 9 in parallel and by patterning of the substrate electrode 15 and the top electrode 19, 20. The substrate electrode 15 forms the output node of the inverter and the two transistors 8, 9 are placed on this electrode 15, while they have individual top electrodes (ground (GRD) 19 and drive voltage ($V_{dd}$) 20, respectively). The drive transistor is connected to the gate electrode 23 (input) that in turn is connected to the output electrode 15 (substrate electrode) of the previous stage in the oscillator. By connecting the output of the last stage in the series to the first one, for instance via pattering of the substrate electrode, the oscillator is formed. In an alternative implementation, the substrate and top electrode have the opposite geometry. The main benefit of this technology is that the oscillator is formed using only two layers of interconnects.

Figure 5:
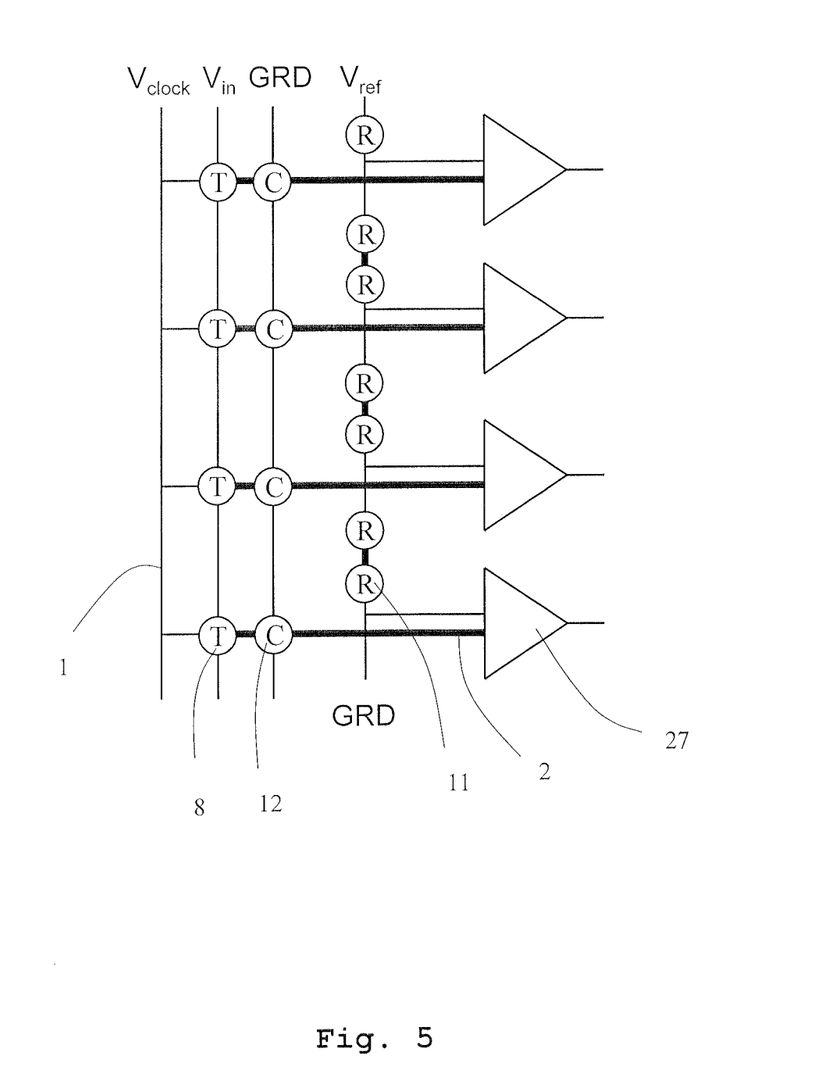
FIG. 5 is a schematic illustration of sample-and-hold circuit according to the present invention.

FIG. 5 illustrates a sample-and-hold circuit according to the present invention. The fundamental building block of the sample-and-hold circuit consists of the series connection of one nanowire transistor 8 and one nanowire capacitor 12. The transistor 8 and capacitor 12 are connected on a top electrode of a second interconnect level 2 that also forms the output of the circuit. The other capacitor electrode is connected to ground while the input is provided to the other transistor ohmic electrode. The gate is used to clock the transistor 8 and to form the sample-and-hold function. The layout of the sample-and-hold circuit may be implemented in two layers of electrodes only, i.e. two levels of interconnects 1, 2. The input, the gate bias, and the ground level may be provided by patterned electrodes on the substrate, while the output may be provided by patterned electrodes on the second integration level. The patterns in these two layers may be formed with an angle to reduce the overlay capacitance. The main benefit of this implementation is the use of to levels of interconnects only. Several sample-and-hold circuits may be formed in parallel to create an analogue-to-digital converter. Also the sample-and-hold circuit may be combined with nanowire resistive ladder that provides the reference voltage to the consecutive comparators. In the case of the resistive ladder nanowire resistors 11 may be formed in pairs in that the current goes between the two interconnect layers with a maintained symmetry that connects to the output of the sample-and-hold circuit.

Figure 6:
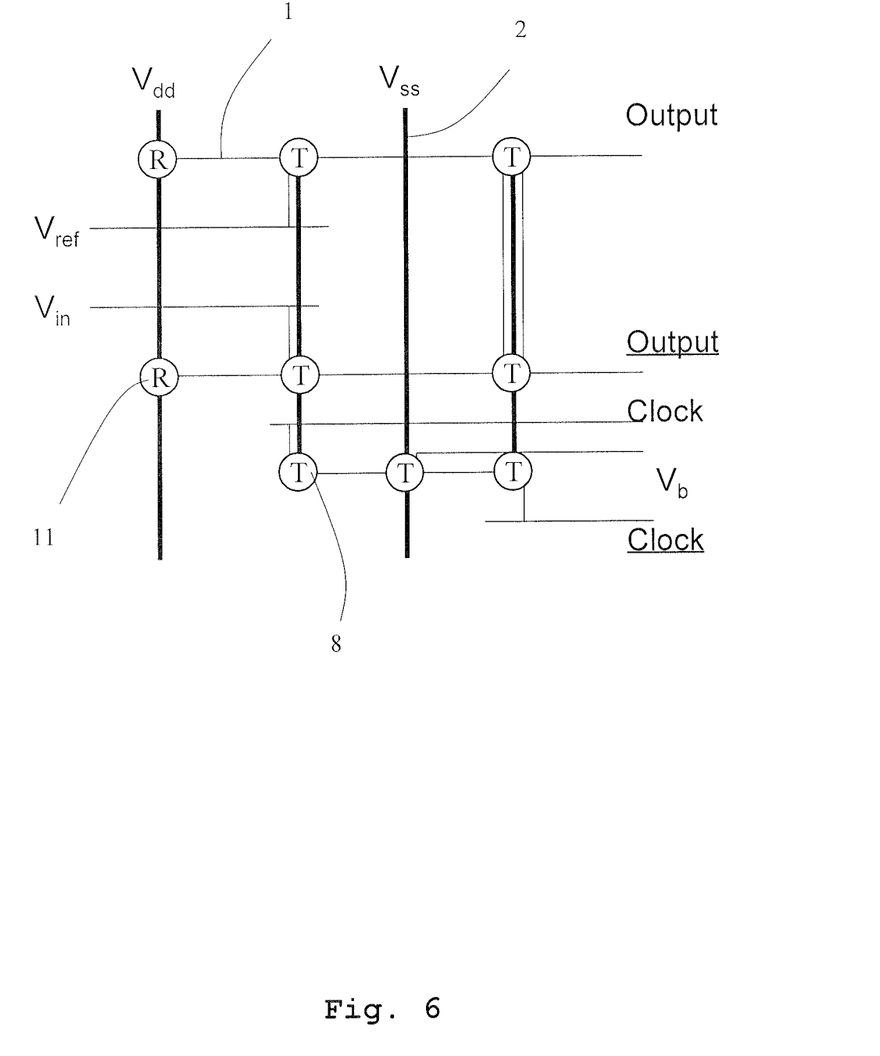
FIG. 6 is a schematic illustration of comparator according to the present invention.

FIG. 6 illustrates a comparator circuit according to the present invention, which is formed by combining nanowire transistors 8 and nanowire resistors 11 in different ways.

A clocked differential comparator may consist of two resistors 11 and seven transistors 8 wherein the integration is performed using two levels of interconnects, i.e. two levels of electrodes. Two resistor/transistor pairs are used to form a differential amplifier and the rest of the transistors are used to clock the comparator and to buffer the output. The main benefit of the presented comparator is that it can be formed using two layers of interconnects and where these may form an angle in order to reduce the parasitic capacitance and to transfer the signal within the circuit. The two different directions may also be used to access the circuit and to provide the input and the clock signals.

Although the embodiment have been described in terms of nanowires protruding from a substrate a skilled person realizes that the substrate may be provided with intermediate layer between the nanowires and the substrate.

Generally, all terms used in the claims are to be interpreted according to their ordinary meaning in the technical field, unless explicitly defined otherwise herein.

While the invention has been described in connection with what is presently considered to be the most practical and preferred embodiments, it is to be understood that the invention is not to be limited to the disclosed embodiments, on the contrary, is intended to cover various modifications and equivalent arrangements within the appended claims.

The invention claimed is:

1. A nanowire circuit comprising at least a first nanowire transistor, wherein the first nanowire transistor comprises a first nanowire protruding from a substrate, the first nanowire having a first wrap gate electrode arranged around a portion of its length, characterized in that two interconnects levels are used, one of which is a first interconnect level located on the substrate providing an electrode connected to one end of the first nanowire, and the first wrap gate electrode of the first nanowire is provided in one of the two interconnect levels and the first wrap gate electrode is electrically connected to the electrode located in the first interconnect level connected to one end of the first nanowire,
  wherein the first wrap gate electrode is directly electrically connected to an electrode layer located on the substrate and directly electrically connected to the portion of the nanowire surrounded by the first wrap gate electrode.

2. A nanowire circuit according to claim 1, wherein the nanowire circuit comprises a second vertical nanowire transistor comprising a second nanowire protruding from the substrate; the second nanowire has a second wrap gate electrode arranged around a portion of its length; and the first and the second nanowires have the same charge carrier types.

3. A nanowire circuit according to claim 1, wherein the nanowires are arranged on the electrode of the first interconnect level.

4. A nanowire circuit according to claim 2, wherein one end of each of the first and the second nanowires are connected to a common source/drain electrode in one of the two interconnect levels and the other end of each of the first and the second nanowires are connected to individual electrodes in the other of the two interconnect levels forming a transistor pair.

5. A nanowire circuit according to claim 4, wherein one end of each of the first and the second nanowires are connected to a common source/drain electrode in the first interconnect level and the other end of each of the first and the second nanowires are connected to individual electrodes in the second interconnect level.

6. A nanowire circuit according to claim 4, wherein the first wrap gate electrode is connected to a voltage input terminal and the second wrap gate electrode is connected to the common source/drain electrode.

7. A nanowire circuit according to claim 1, wherein the nanowire circuit comprises nanowire resistors.

8. A nanowire circuit according to claim 1, wherein the nanowire circuit further comprises nanowire capacitors.

9. A nanowire circuit according to claim 4, wherein a plurality of transistor pairs, each having an input and an output, are connected in series with the output of one transistor pair connected to the input of another transistor pair to form a ring-oscillator.

10. A nanowire circuit according to claim 9, wherein the first and the second nanowire have different charge carrier type and the output from a node between the first and second vertical nanowire transistors of said one transistor pair is connected to the first and the second wrap gate electrodes of said another transistor pair.

11. A nanowire circuit according to claim 9, wherein the first and the second vertical nanowire transistor have different threshold voltages and the output from a node between the between the first and second vertical nanowire transistors of said one transistor pair is connected to the first wrap gate electrode of said another transistor pair, the second wrap gate electrode being connected to the output.

12. A nanowire circuit according to claim 1, wherein the circuit is adapted for sample-and-hold applications or to be used as a comparator.

13. A nanowire circuit according to claim 1, wherein the nanowires are made of a III-V semiconductor material.

14. A nanowire circuit according to claim 1, wherein the substrate is made of a III-V semiconductor material.

15. A nanowire circuit according to claim 1, wherein the electrode of the first interconnect level connects to the nanowires in a wrap around configuration.

16. A nanowire circuit according to claim 1, wherein:
  the nanowire circuit further comprises a second vertical nanowire transistor comprising a second nanowire protruding from the substrate;
  the second nanowire has a second wrap gate electrode arranged around a portion of its length;
  the second wrap gate electrode is located in the first interconnect level and then second wrap gate electrode is electrically connected to a voltage input terminal;
  the electrode located in the first interconnect level comprises a common source/drain electrode;
  the first wrap gate electrode is located in the first interconnect level and the first wrap gate electrode is electrically connected to the common source/drain electrode;
  a bottom end of the first nanowire and a bottom end of the second nanowire are connected to the common source/drain electrode in the first interconnect level;
  a top end of the first nanowire is connected to a first individual electrode in the second interconnect level; and
  a top end of the second nanowire is connected to a second individual electrode in the second interconnect level.

* * * * *